United States Patent
Shimada et al.

(10) Patent No.: US 7,554,104 B2
(45) Date of Patent: Jun. 30, 2009

(54) BOLT AND SEMICONDUCTOR MANUFACTURING APPARATUS

(75) Inventors: Yoshirou Shimada, Kumamoto (JP); Hiroki Etou, Kumamoto (JP); Ryou Kashihara, Kumamoto (JP)

(73) Assignee: NEC Electronics Corporation, Kanagawa (JP)

( * ) Notice: Subject to any disclaimer, the term of this patent is extended or adjusted under 35 U.S.C. 154(b) by 298 days.

(21) Appl. No.: 11/724,223

(22) Filed: Mar. 15, 2007

(65) Prior Publication Data
US 2007/0243057 A1    Oct. 18, 2007

(30) Foreign Application Priority Data
Mar. 17, 2006   (JP)   ............................. 2006-074101

(51) Int. Cl.
*H01J 37/317*   (2006.01)
(52) U.S. Cl. ............................. 250/492.1; 250/492.21; 411/395

(58) Field of Classification Search ............... 250/492.1, 250/492.2, 492.21, 492.3; 411/383, 384, 411/395, 14.5; 439/359, 543, 659, 663, 664, 439/700
See application file for complete search history.

(56) References Cited

U.S. PATENT DOCUMENTS 3,159,075 A * 12/1964 Bjork ........................ 411/65
7,414,355 B2 * 8/2008 Kanarov et al. ............. 313/238

FOREIGN PATENT DOCUMENTS

JP    07-180053    7/1995
JP    7180053    *  7/1995

* cited by examiner

*Primary Examiner*—David A Vanore
*Assistant Examiner*—Michael Maskell
(74) *Attorney, Agent, or Firm*—Young & Thompson

(57) ABSTRACT

A bolt includes a main body and a spring pin. The main body includes a head and a shaft. The spring pin includes a base portion and an end portion. The shaft includes a portion of external thread and a hollow portion. The head includes a top surface and a hole opened in the top surface. The hole is connected to the hollow portion. The base portion is arranged in the hollow potion to move along an axis of the main body. The end portion is arranged in the hole to move along the axis. The spring pin is energized toward a side of the head such that the end portion protrudes beyond the top surface. The end portion is electrically connected to the portion of external thread.

7 Claims, 7 Drawing Sheets

BOLT AND SEMICONDUCTOR MANUFACTURING APPARATUS

BACKGROUND OF THE INVENTION

1. Field of the Invention

The present invention relates to a bolt and a semiconductor manufacturing apparatus, particularly to a bolt used preferably for a wafer holding device holding a wafer, to which an ion beam is irradiated, and a semiconductor manufacturing apparatus processing a wafer by irradiating an ion beam thereto.

2. Description of the Related Art

One of important steps of manufacturing a semiconductor device is a step of doping a semiconductor material with a small amount of a chemical element. Ion implantation is known as a method of doping a semiconductor wafer with dopant atoms. The ion implantation is a technique for doping the semiconductor wafer by ionizing the dopant atoms, accelerating the ionized atoms to form an ion beam with a necessary energy and irradiating the ion beam to a front surface of the wafer. The ionized atom repeats collision with constituent atoms of the semiconductor crystal and finally stops in the crystal.

In the ion implantation, insufficient grounding of the wafer causes electrification of the wafer resulting in uneven irradiation of the ion beam to the front surface of the wafer. As the result, the uniformity of the dopant distribution within the wafer surface becomes worse to cause a quality degradation and a yield loss of the semiconductor device.

Japanese Laid Open Patent Application (JP-A-Heisei 7-180053) discloses a conventional wafer holding device, which discharges electric charges from a back surface of a wafer to a base.

FIGS. 1 and 2 show the wafer holding device according to the Japanese Laid Open Patent Application (JP-A-Heisei 7-180053). FIG. 1 shows a sectional view of the wafer holding device holding a wafer 400. FIG. 2 shows a plan view of the wafer holding device. In FIG. 2, the wafer 400 is omitted. The wafer holding device is installed in a semiconductor manufacturing apparatus.

In general, an insulation film such as a photoresist or an insulating oxide is formed on a front surface of the wafer 400 and, thus, the wafer 400 cannot be grounded via a damper 403 pressing a peripheral portion of the wafer 400 to a base 401. In addition, a rubber-like elastic body 402 contacting with the back surface of the wafer 400 is dielectric and, hence, the wafer 400 cannot be grounded via the rubber-like elastic body 402.

Therefore, in such a wafer holding device, a discharging pass is formed by installing a pin 404, a spring 405 and a lid 406 of electrically conductive materials in the base 401, by making a through-hole 402a in the rubber-like elastic body 402 and by pressurizing the pin 404 with the spring 405 to the back surface of the wafer 400 to make a contact between the pin 404 and the back surface.

When sliding portions of the pin 404 and the spring 405 are deteriorated to cause awkward movement of the pin 404 and when the surfaces of the pin 404 and the spring 405 are stained to increase a contact resistance between the pin 404 and the spring 405, the pin 404 and the spring 405 should be replaced by new ones.

However, when the pin 404 and the spring 405 are replaced, it is necessary to remove the lid 406 from the base 401 for removing the old pin 404 and spring 405 and to mount a new pin and spring on the base 401 followed by attaching the lid 406 to the base 401. Thus, many steps are required for the replacement.

Particularly, when the pin 404 and the spring 405 cannot be replaced in the state where the base 401 is fixed to a shaft of a motor for rotating the wafer holding device, the step of removing once the base from and attaching again to the shaft is necessary and, hence, a period for which the semiconductor manufacturing apparatus cannot be used becomes longer.

SUMMARY OF THE INVENTION

It has now been discovered that many steps are required for the replacement of a grounding pin of a wafer holding device of a semiconductor manufacturing apparatus.

In an aspect of the present invention, a bolt includes a main body and a spring pin. The main body includes a head and a shaft. The spring pin includes a base portion and an end portion. The shaft includes a portion of external thread and a hollow portion. The head includes a top surface and a hole opened in the top surface. The hole is connected to the hollow portion. The base portion is arranged in the hollow potion to move along an axis of the main body. The end portion is arranged in the hole to move along the axis. The spring pin is energized toward a side of the head such that the end portion protrudes beyond the top surface. The end portion is electrically connected to the portion of external thread.

In another aspect of the present invention, a semiconductor manufacturing apparatus includes a wafer holding device for holding a wafer, an ion beam irradiating apparatus for irradiating ion beam to the wafer, a support supporting the wafer holding device, and a bolt tightening the wafer holding device to the support. The bolt includes a main body and a spring pin. The main body includes a head and a shaft. The shaft includes a portion of external thread and a hollow portion. The spring pin includes a base portion and an end portion. The head includes a top surface and a hole opened in the top surface. The hole is connected to the hollow portion. The base portion is arranged in the hollow potion to move along an axis of the main body. The end portion is arranged in the hole to move along the axis. The support includes a portion of internal thread, in which the portion of external thread is screwed. The wafer holding device includes a base having a supporting surface. The supporting surface contacts to a back surface of the wafer. The base includes a spot facing hole opened in the supporting surface and a shaft hole connecting the spot facing hole to the portion of internal thread. The head is arranged in the spot facing hole. The spring pin is energized toward a side of the head such that the end portion protrudes beyond the top surface. The end portion is electrically connected to the portion of external thread. The support is grounded.

The present invention makes it easy to replace the pin for grounding the wafer.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

The embodiments of the present invention will be described below with reference to the accompanying drawings.

First Embodiment

Figure 1:
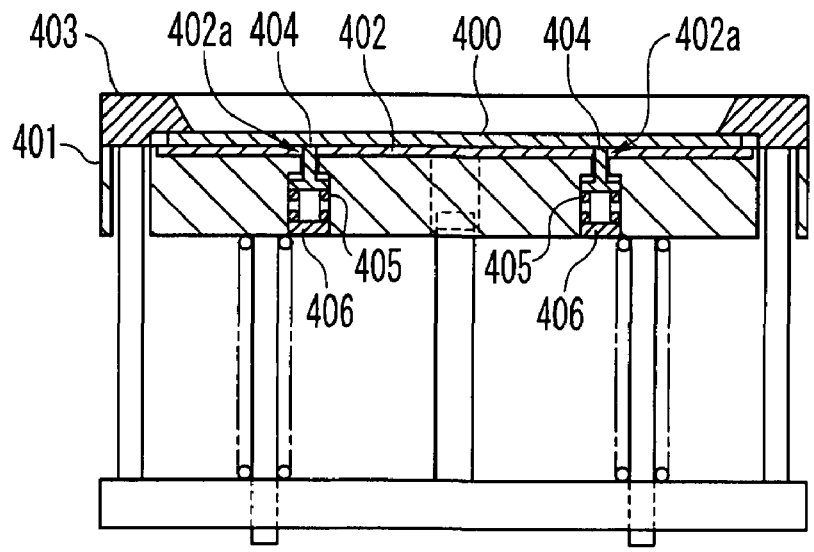
FIG. 1 is a sectional view showing a conventional wafer holding device.
Figure 2:
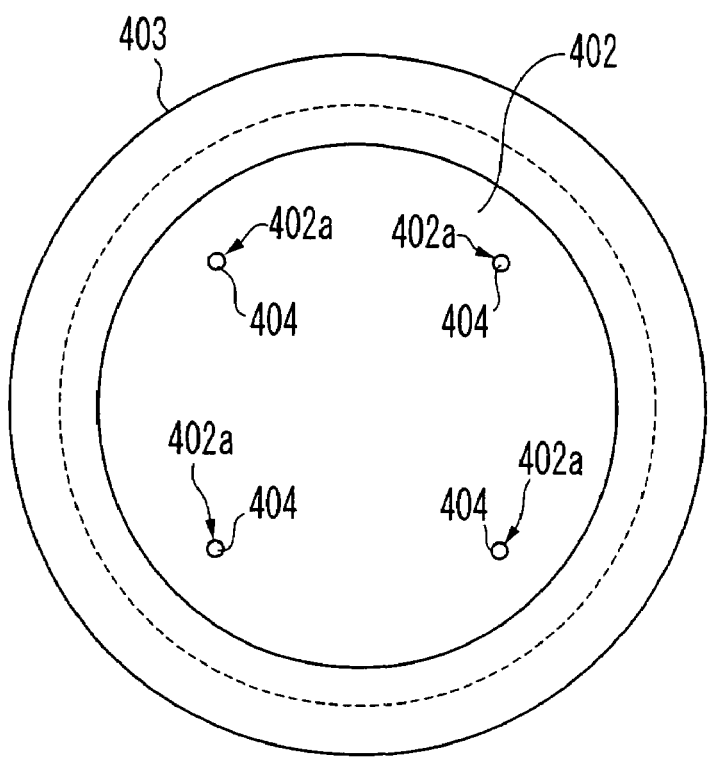
FIG. 2 is a plan view showing the conventional wafer holding device.
Figure 3:
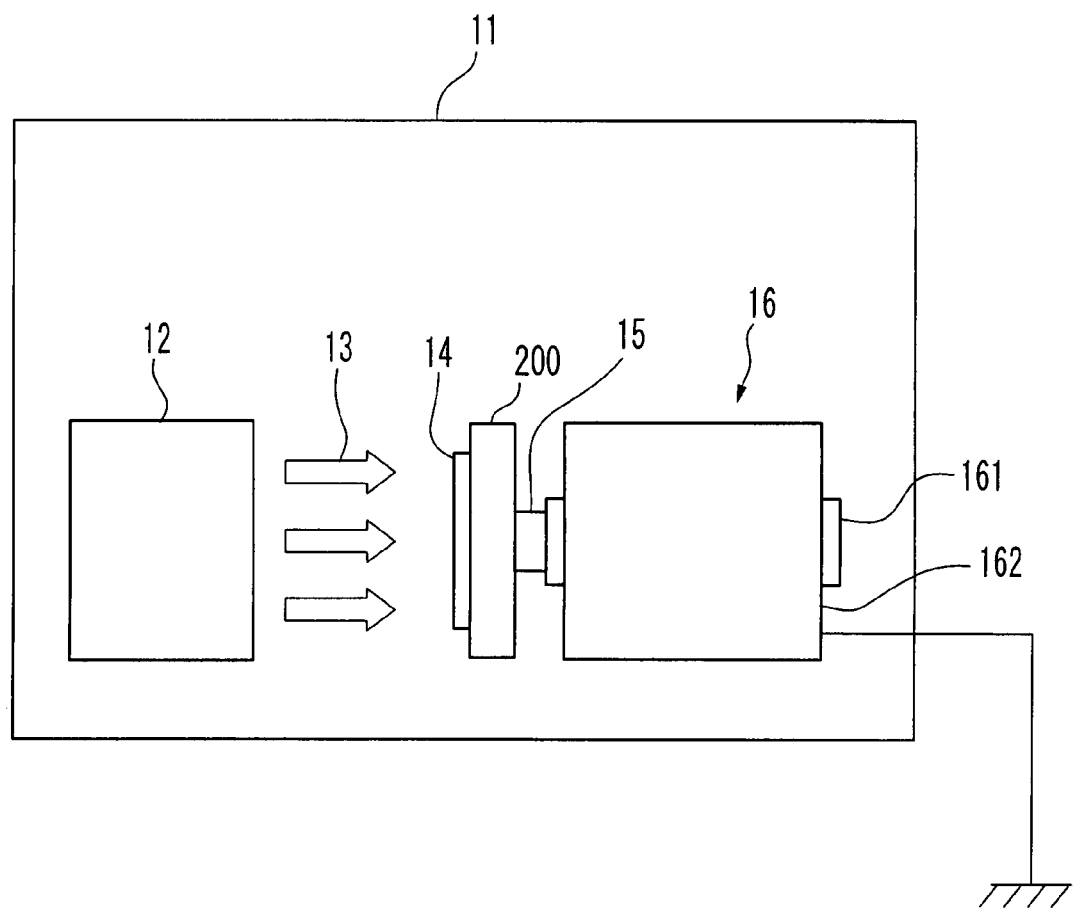
FIG. 3 shows a semiconductor manufacturing apparatus according to a first embodiment of the present invention.

FIG. 3 shows a semiconductor manufacturing apparatus 100 according to a first embodiment of the present invention. The semiconductor manufacturing apparatus 100 includes a wafer holding device 200 for holding a wafer 14 in a vacuum container 11, a support 15 for supporting the wafer holding device 200, and an ion beam irradiating apparatus 12 for irradiating ion beam 13 to the wafer 14. When the support 15 is a shaft of a motor 16 such as a rotation angle motor, the wafer 14 can be rotated together with the wafer holding device 200. The motor 16 includes a bearing 161 for supporting the support 15 to enable the support 15 to rotate and a bracket 162 equipped with the bearing 161. The bearing 161 is exemplified by a ball bearing. The support 15 is grounded via the bearing 161 and the bracket 162.

The semiconductor manufacturing apparatus 100 is exemplified by an ion implantation apparatus, ion beam etching apparatus and spattering apparatus using ion beam.

The wafer holding device 200 and a bolt 300, which is a hexagon socket head cap bolt and tightens the wafer holding device 200 to the support 15, will be described referring to FIGS. 4 to 6.

Figure 4:
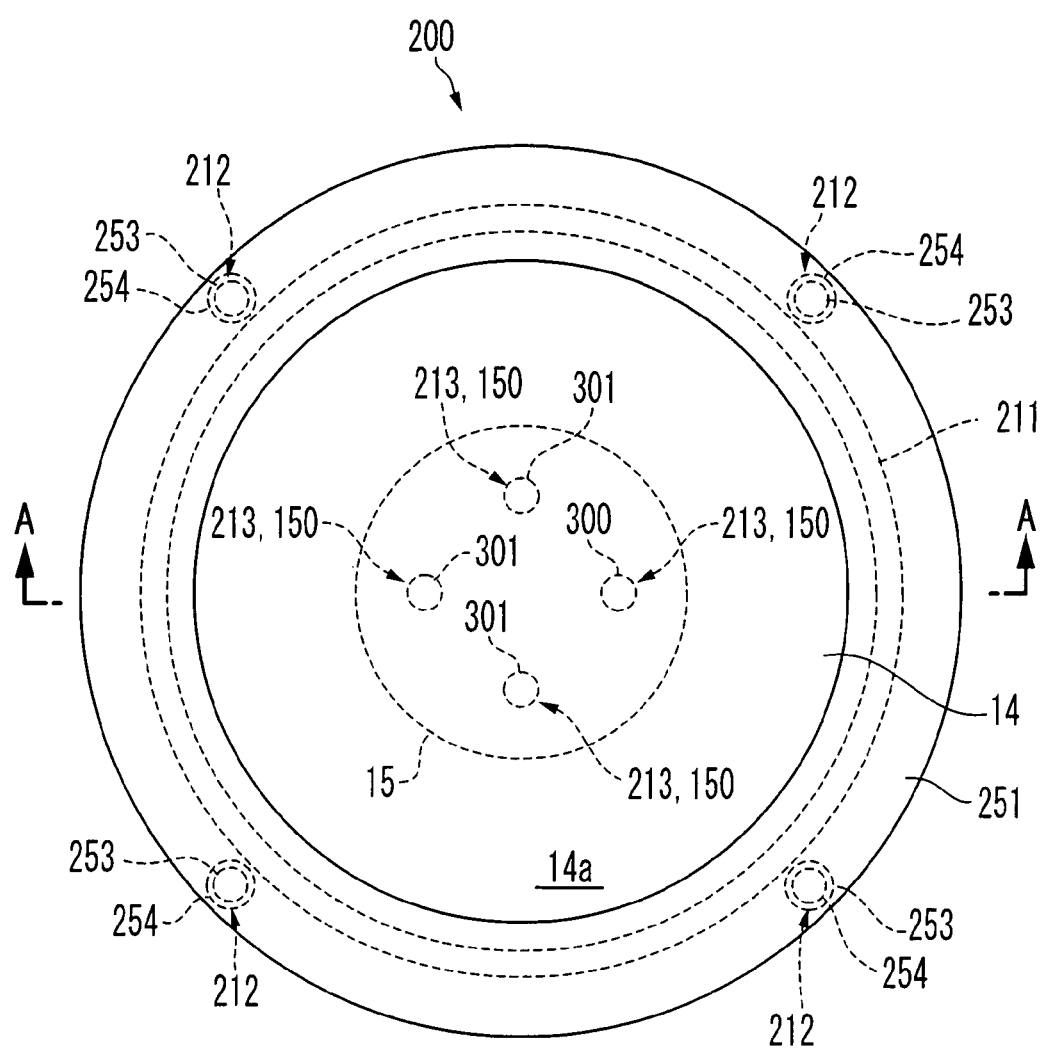
FIG. 4 is a plan view showing a wafer holding device according to the first embodiment of the present invention.
Figure 5:
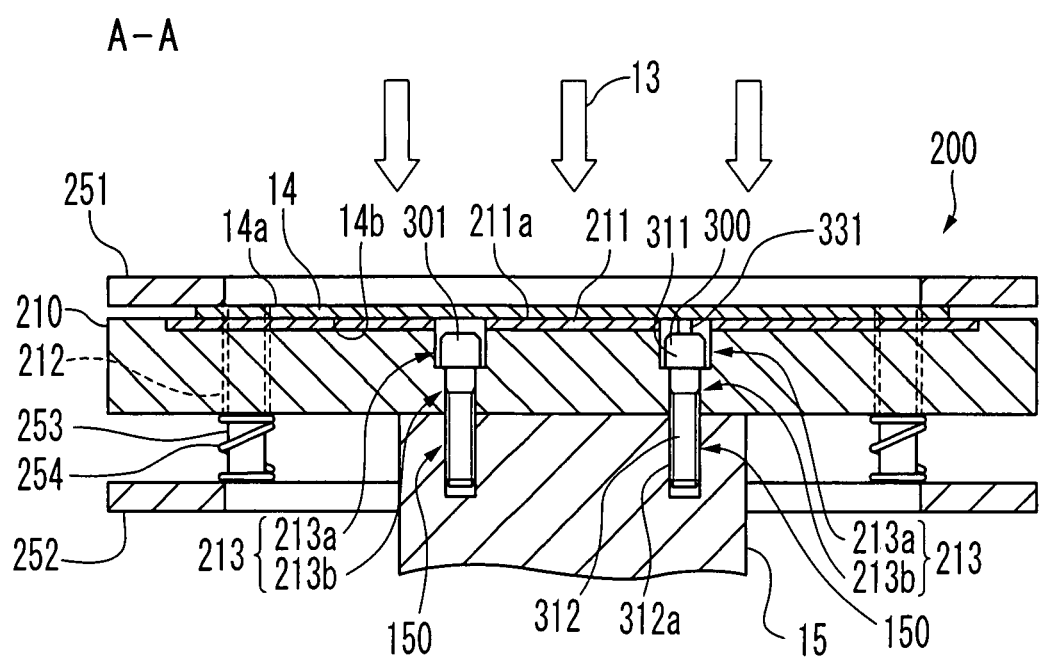
FIG. 5 is a sectional view showing the wafer holding device according to the first embodiment of the present invention.

FIGS. 4 and 5 show a plan view and a sectional view of the wafer holding device 200, respectively. The wafer holding device 200 has a base 210 equipped with a wafer support member 211. According to the first embodiment, the wafer support member 211 is an insulating rubber. A supporting surface 211a of the wafer support member 211 faces to and contacts to a back surface 14b of the wafer 14. The wafer 14 includes a front surface opposite to the back surface 14b. The ion beam 13 is irradiated to the front surface 14a. The wafer holding device 200 includes a clamp ring 251, an annular plate 252, a connecting shaft 253 and a spring 254. The clamp ring 251 presses a peripheral portion of the wafer 14 to the base 210. The base 210 is arranged between the annular plate 252 and the clamp ring 251. The connecting shaft 253 is extending through a through-hole 212 in the base 210. One end of the connecting shaft 253 is connected with the clamp ring 251 and the other end of it is connected with the annular plate 252. The spring 254 energizes the base 210 and the annular plate 252 to keep a distance between them. In other words, the clamp ring 251 presses the wafer 14 to the base 210 by an energizing force of the spring 254 affecting the annular plate 252. As the result, the back surface 14b contacts closely to the supporting surface 211a. The supporting surface 211a works as a positioning plane for positioning the wafer 14.

The wafer holding device 200 is supported by the support 15. The base 210 is arranged between the wafer support member 211 and the support 15. The support 15 has a portion of internal thread 150, which is connected to a through-hole 213 in the base 210. The through-hole 213 has a spot facing hole 213a and a shaft hole 213b. The spot facing hole 213a penetrates through the wafer support member 211 and is opened in the supporting surface 211a. The shaft hole 213b is opened in the bottom of the spot facing hole 213a. The shaft hole 213b connects the spot facing hole 213a with the portion of internal thread 150.

The base 210 and the support 15 have a plurality of couples of the through-hole 213 and the portion of internal thread 150. In each of these couples, the bolt 300 or a bolt 301 is arranged. The bolt 301 is a hexagon socket head cap bolt. The base 210 and the support 15 are tightened with one bolt 300 and three bolts 301. The bolt 300 has a spring pin 330 touching the back surface 14b. The bolt 301 does not have a spring pin.

Fixing the base 210 to the support 15 by using hexagon socket head cap bolts such as the bolts 300 and 301 allows making a diameter of the spot facing hole 213a small and allows making an area of the wafer 14 contacting to the wafer support member 211 large. Therefore, deformation of the wafer 14 can be prevented.

The base 210 has a pipe (not shown in FIGS. 4 and 5) in which coolant flows to cool the wafer 14. The coolant is supplied from the support 15, flows in the pipe of the base 210, absorbs heat from the wafer 14, and returns to the support 15.

Figure 6:
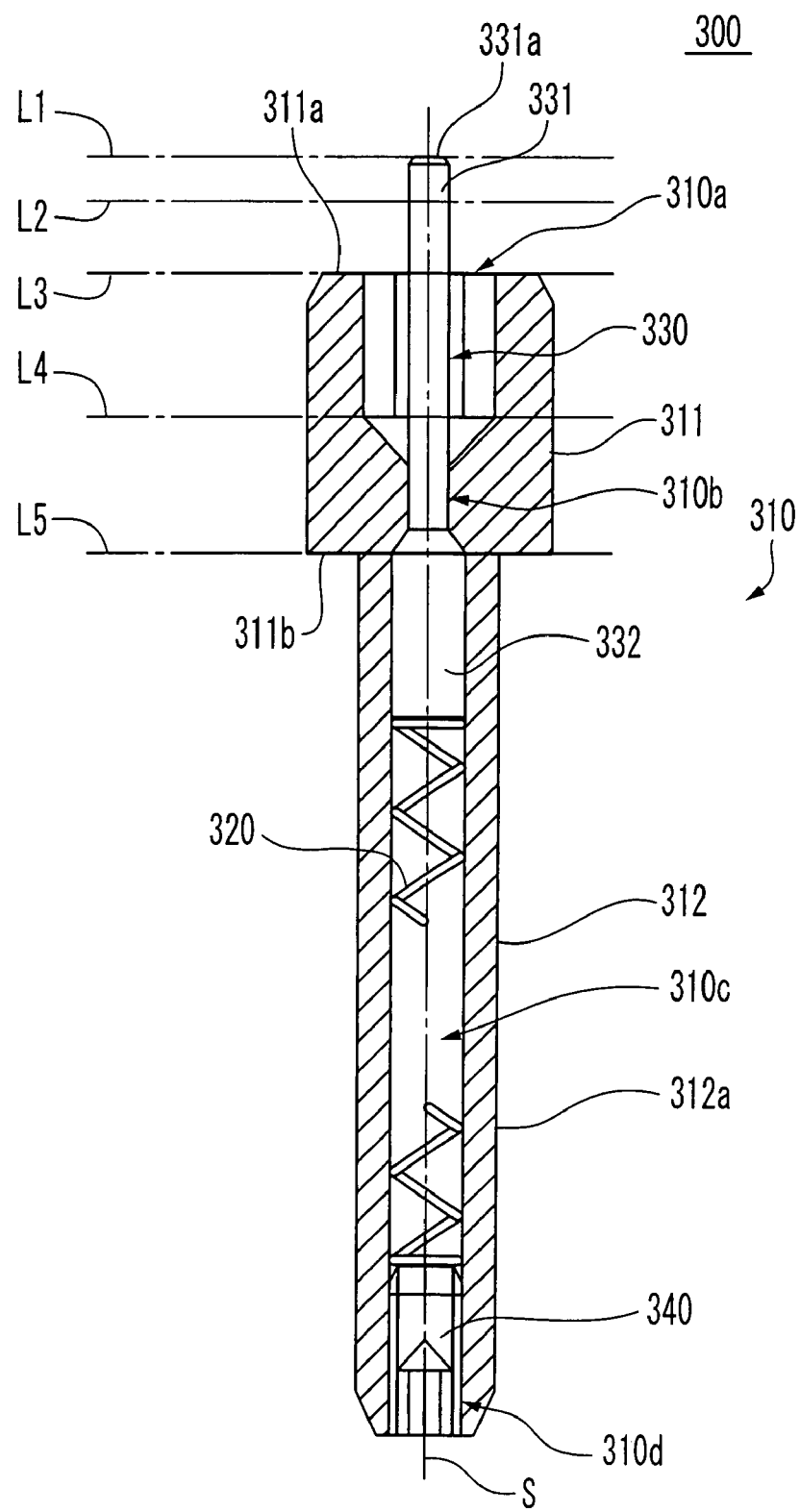
FIG. 6 shows a bolt according to the first and second embodiments of the present invention.

FIG. 6 shows the sectional view of the bolt 300. The bolt 300 has a main body 310, a spring 320, a spring pin 330, and a spring fixing member 340. The main body 310 has a head 311 and a shaft 312. The head 311 has a hexagon socket (hexagon hole) 310a opened in a top surface 311a of the head 311. The shaft 312 has a portion of external thread 312a and a hollow portion 310c. A connecting hole 310b in the head 311 connects the hexagon socket 310a with the hollow portion 310c and is opened in the bottom of the hexagon socket 310a. The spring pin 330 has a base portion 332, which can move in the hollow portion 310c along an axis S of the main body 310, and an end portion 331 connected with the base portion 332. The end portion 331 is inserted in the connecting hole 310b to reach the hexagon socket 310a. The hollow portion 310c has an opening 310d in an end of the shaft 312. The spring fixing member 340, which is fixed to the end of the shaft 312, closes the opening 310d. The spring 320 arranged in the hollow portion 310c between the base portion 332 and the spring fixing member 340 energizes the base portion 332 to a side of the head 311. The spring 320 is a helical compression spring.

When an internal thread is made in the opening 310d and the spring fixing member 340 as a set screw is screwed in the opening 310d, the bolt 300 can be made easily.

The main body 310, the spring 320, the spring pin 330, and the spring fixing member 340 are made of an electric conducting material, which is exemplified by a metal such as stainless steal.

FIG. 6 shows virtual planes L1 to L5, which are vertical to the axis S. The virtual planes L1 to L5 are arranged in this sequence in a direction viewing the shaft 312 from the head 311. The virtual plane L3 indicates a position of the top surface 311a. The virtual plane L5 indicates a position of a bearing surface 311b of the head 311. When the bolt 300 tightens the base 210 to the support 15, the virtual plane L5 also indicates a position of the bottom of the spot facing hole 213a.

The end portion 331 and the base portion 332 have cylindrical shapes. The connecting hole 310b has a circular section. The diameter of the end portion 331 is smaller than the inner diameter of the connecting hole 310b. The diameter of the base 332 is larger than the inner diameter of the connecting hole 310b. Hence, the spring pin 330, which is energized by the spring 320, stops in the position where the end surface 331a of the spring pin 330 is on the virtual plane L1. At this time, the end portion 331 protrudes beyond the top surface 311a.

When the base 210 is tightened to the support 15 with the bolt 300, the bolt 300 is inserted into the through-hole 213, the portion of external thread 312a is screwed in and tightened to the portion of internal thread 150 by using a hexagonal wrench (not shown) until the bearing surface 311b contacts to the bottom of the spot facing hole 213a. At this time, the spring pin 330 is pressed down by the hexagonal wrench and the end surface 331a is located in a position indicated by the virtual plane L4.

Mounting the wafer 14 on the supporting surface 211a to contact the back surface 14b closely to the supporting surface 211a results in pressing down the spring pin 330 by the wafer 14 to the position where the end surface 331a is located in a position indicated by the virtual plane L2. At this time, the virtual plane L2 indicates a position of the supporting surface 211a and the back surface 14b.

In this status, the spring pin 330 is energized by the spring 320 and, thus, the back surface 14b contacts securely to the end surface 331a. In addition, the bolt 300 tightens base 210 to the support 15 and, thus, the portion of external thread 312a contacts securely to the portion of internal thread 150. In addition, the spring 320 is compressed and, hence, the spring 320 contacts securely to the base 332 and to the spring fixing member 340. And, if the spring fixing member 340 is screwed in the opening 310d, the spring fixing member 340 contacts with the shaft 312 securely. Consequently, the wafer 14 is securely grounded.

The bolt 300 connects directly to the grounded support 15. Therefore, there are few face contacts in a discharge route from the wafer 14 to the ground. As the result, a probability, in which the wafer 14 is insufficiently grounded because of a contact failure, is low.

Consequently, the semiconductor manufacturing apparatus 100 has a high reliability of keeping the wafer 14 grounded. Hence, an accumulation of electric charge on the wafer 14 is suppressed and the ion beam 13 is irradiated evenly to the front surface 14a. Therefore, the performances and the yield of the semiconductor device manufactured by the semiconductor manufacturing apparatus 100 are improved. Moreover, since frequent maintenance is not required for keeping the grounding state of the wafer 14 good and, thus, the rate of operation of the semiconductor manufacturing apparatus 100 is improved.

When the end surface 331a is stained and when the spring pin 330 slides awkwardly, all needed is to replace the bolt 300 with a new one. The bolt 300 can be replaced easily, because the spring pin 330 touching the wafer 14 and the spring 320 energizing the spring pin 330 are made in a unit and because the bolt 300 is attached and detached by the threads. Moreover, replacing the bolt 300 does not require removing the base 210 from the support 15 and, therefore, the bolt 300 can be replaced in a short time.

In FIGS. 4 and 5, the base 210 is tightened to the support 15 with one bolt 300 and three bolts 301. However, the base 210 can be tightened to the support 15 with two bolts 300 and two bolts. Using a plurality of bolts 300, even in a case where the end surface 331a of one bolt 300 is stained, enables other bolt 300 to ground the wafer 14.

Number and arrangement of the bolts 300 and 301 can be changed if required.

Second Embodiment

When rotation of the wafer 14 is not required for the semiconductor manufacturing apparatus 100, the wafer 14 may be held by electrostatic attraction.

Figure 7:
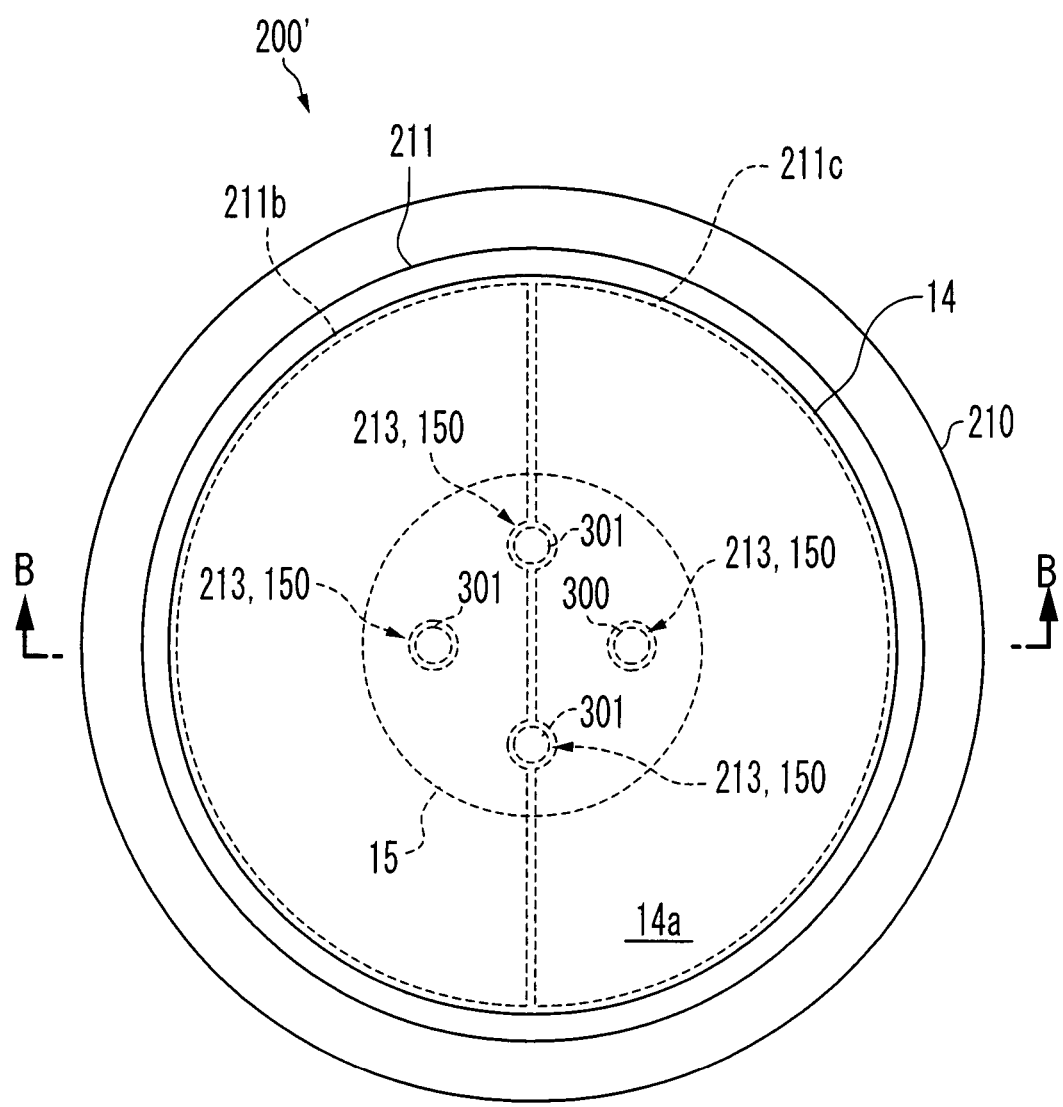
FIG. 7 is a plan view showing a wafer holding device according to a second embodiment of the present invention.
Figure 8:
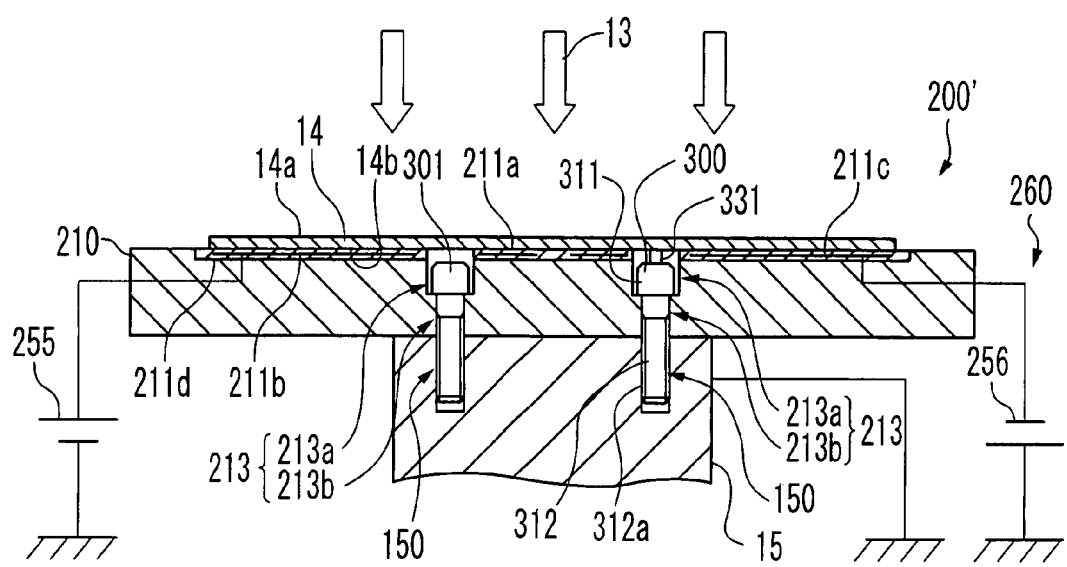
FIG. 8 is a sectional view showing the wafer holding device according to the second embodiment of the present invention.

FIGS. 7 and 8 show a plan view and a sectional view of a wafer holding device 200' according to a second embodiment, respectively. The wafer holding device 200' has common elements with the wafer holding device 200 according to the first embodiment. The elements are designated by the same symbols used for the first embodiment. The description of the elements will be omitted.

The wafer holding device 200' holds the wafer 14 in the vacuum container 11. The wafer holding device 200' has the base 210 tightened to the support 15 with the bolt 300 and the bolt 301. According to the second embodiment, the support 15 may not be the shaft of the motor 16. When the support 15 does not rotate, the support 15 can be grounded directly.

The wafer holding device 200' has a bipolar type electrostatic chuck 260. The electrostatic chuck 260 includes the wafer support member 211 and direct current power supplies 255 and 256. The wafer support member 211 according to the second embodiment is a plate having two electrode plates 211b and 211c arranged on the same plane and an insulating layer 211d covering the electrode plates 211b and 211c. The wafer 14 is mounted on the wafer support member 211. Applying a positive voltage to the electrode plate 211b by the direct current power supply 255 induces electric charges of opposite polarities on the wafer 14 and the electrode plate 211b. Applying a negative voltage to the electrode plate 211c by the direct current power supply 256 induces electric charges of opposite polarity on the wafer 14 and the electrode plate 211c. The wafer 14 is held by electrostatic attraction on the wafer support member 211, resulting in that the back surface 14b contacts closely to the supporting surface 211a.

In the first and second embodiments according to the present invention, the hexagon socket head cap bolt with the spring pin 330 is described. However, such spring pin can be also applied to the hexagon head bolt.

It is apparent that the present invention is not limited to the above embodiment, but may be modified and changed without departing from the scope and spirit of the invention.

What is claimed is:

1. A bolt comprising:
a main body including a head and a shaft; and
a spring pin including a base portion and an end portion,
wherein said shaft includes a portion of external thread and a hollow portion,
said head includes a top surface and a hole opened in said top surface,
said hole is connected to said hollow portion,
said base portion is arranged in said hollow potion to move along an axis of said main body,
said end portion is arranged in said hole to move along said axis,
said spring pin is energized toward a side of said head such that said end portion protrudes beyond said top surface, and said end portion is electrically connected to said portion of external thread.

2. The bolt according to claim 1, wherein a portion of said hole is a hexagon hole, and said portion of said hole is opened in said top surface.

3. The bolt according to claim 1, further comprising:

a set screw; and a helical compression spring, wherein said set screw is screwed in an opening portion of said hollow potion, said opening portion is opened in a end of said shaft, and said helical compression spring is arranged in said hollow portion between said base portion and said set screw.

4. A semiconductor manufacturing apparatus comprising:

a wafer holding device for holding a wafer;

an ion beam irradiating apparatus for irradiating ion beam to said wafer;

a support supporting said wafer holding device; and a bolt tightening said wafer holding device to said support, wherein said bolt includes a main body and a spring pin, said main body includes a head and a shaft, said shaft includes a portion of external thread and a hollow portion, said spring pin includes a base portion and an end portion, said head includes a top surface and a hole opened in said top surface, said hole is connected to said hollow portion, said base portion is arranged in said hollow potion to move along an axis of said main body, said end portion is arranged in said hole to move along said axis, said support includes a portion of internal thread in which said portion of external thread is screwed, said wafer holding device includes a base having a supporting surface, said supporting surface contacts to a back surface of said wafer, said base includes a spot facing hole opened in said supporting surface and a shaft hole connecting said spot facing hole to said portion of internal thread, said head is arranged in said spot facing hole, said spring pin is energized toward a side of said head such that said end portion protrudes beyond said top surface, said end portion is electrically connected to said portion of external thread, and said support is grounded.

5. The semiconductor manufacturing apparatus according to claim 4, wherein said support is a shaft of a motor.

6. The semiconductor manufacturing apparatus according to claim 5, wherein said wafer holding device includes a clamp ring pressing a peripheral portion of said wafer to said base.

7. The semiconductor manufacturing apparatus according to claim 4, wherein said wafer holding device includes a bipolar type electrostatic chuck.

* * * * *